(12) United States Patent
De Kruif et al.

(10) Patent No.: US 8,089,613 B2
(45) Date of Patent: *Jan. 3, 2012

(54) LITHOGRAPHIC APPARATUS, EXCIMER LASER AND DEVICE MANUFACTURING METHOD

(75) Inventors: Robertus Cornelis Martinus De Kruif, Eindhoven (NL); Richard Joseph Bruls, Eindhoven (NL); Johannes Wilhelmus Maria Cornelis Teeuwsen, Helmond (NL); Erik Petrus Buurman, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 12/838,750

(22) Filed: Jul. 19, 2010

(65) Prior Publication Data

US 2010/0329290 A1  Dec. 30, 2010

Related U.S. Application Data

(63) Continuation of application No. 11/316,346, filed on Dec. 23, 2005, now Pat. No. 7,817,247, which is a continuation-in-part of application No. 11/036,190, filed on Jan. 18, 2005, now abandoned, which is a continuation of application No. 11/019,535, filed on Dec. 23, 2004, now abandoned.

(51) Int. Cl.
G03B 27/54 (2006.01)
G03B 27/42 (2006.01)

(52) U.S. Cl. ............................. 355/67; 355/53
(58) Field of Classification Search .............. 355/67, 355/53, 71, 69; 372/57, 98, 20; 430/5, 296, 430/311; 250/492.23
See application file for complete search history.

(56) References Cited

U.S. PATENT DOCUMENTS

| | | | |
|---|---|---|---|
| 5,303,002 A | 4/1994 | Yan | |
| 5,684,565 A | 11/1997 | Oshida et al. | |
| 5,976,714 A | 11/1999 | Arita et al. | |
| 6,671,294 B2 | 12/2003 | Kroyan et al. | |
| 7,534,552 B2 | 5/2009 | De Kruif et al. | |
| 7,595,863 B2 | 9/2009 | Kruif et al. | |
| 2001/0026448 A1 | 10/2001 | Koizumi et al. | |
| 2002/0048288 A1 | 4/2002 | Kroyan et al. | |
| 2005/0018164 A1 | 1/2005 | Hansen | |
| 2005/0078292 A1 | 4/2005 | Bruebach | |
| 2005/0190801 A1 | 9/2005 | Sukegawa et al. | |
| 2006/0017906 A1 | 1/2006 | Buurman et al. | |
| 2006/0139607 A1 | 6/2006 | Bruls et al. | |

FOREIGN PATENT DOCUMENTS

JP     2005-191503 A     7/2005

OTHER PUBLICATIONS

English translation of Official Action issued on Mar. 31, 2009 in Japanese Application No. 2005-381198.

*Primary Examiner* — Peter B Kim
(74) *Attorney, Agent, or Firm* — Pillsbury Winthrop Shaw Pittman LLP

(57) ABSTRACT

A CD-pitch dependency for a lithographic pattern printing process is related to the spectral intensity distribution of radiation used for projecting the pattern. A CD-pitch dependency can vary from one system to another. This can result in an iso-dense bias mismatch between systems. The invention addresses this problem by providing a lithographic apparatus including an illumination system for providing a projection beam of radiation, a projection system for projecting a patterned beam onto a target portion of a substrate, and a substrate table for holding the substrate, with a controller to provide an adjustment of the spectral distribution of radiant intensity of the projection beam. The adjustment of the spectral intensity distribution is based on data relating to an iso dense bias, and comprises a broadening of the spectral bandwidth or a change of shape of the spectral intensity distribution.

19 Claims, 10 Drawing Sheets

LITHOGRAPHIC APPARATUS, EXCIMER LASER AND DEVICE MANUFACTURING METHOD

RELATED APPLICATIONS

The present application is a continuation of U.S. patent application Ser. No. 11/316,346, filed on Dec. 23, 2005 now U.S. Pat. No. 7,817,247, now allowed, which is a continuation in part of U.S. patent application Ser. No. 11/036,190, filed Jan. 18, 2005 now abandoned, which is a continuation of U.S. patent application Ser. No. 11/019,535, filed Dec. 23, 2004 now abandoned the entire contents of each foregoing application hereby incorporated by reference.

BACKGROUND OF THE INVENTION

1. Field of the Invention

The present invention relates to a lithographic apparatus, an excimer laser and a device manufacturing method. This invention also relates to a device manufactured thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

Between the reticle and the substrate is disposed a projection system for imaging the irradiated portion of the reticle onto the target portion of the substrate. The projection system includes components for directing, shaping or controlling the projection beam of radiation. The projection system may, for example, be a refractive optical system, or a reflective optical system, or a catadioptric optical system, respectively including refractive optical elements, reflective optical elements, and both refractive and reflective optical elements.

Generally, the projection system comprises a device to set the numerical aperture (commonly referred to as the "NA") of the projection system. For example, an adjustable NA-diaphragm is provided in a pupil of the projection system.

An illumination system may also encompass various types of optical components, including refractive, reflective, and catadioptric optical components for directing, shaping, or controlling the projection beam of radiation, and such components may also be referred to below, collectively or singularly, as a "lens". The illumination system of the apparatus typically comprises adjustable optical elements for setting an outer and/or inner radial extent (commonly referred to as σ-outer and σ-inner, respectively) of an intensity distribution upstream of the mask, in a pupil of the illumination system. A specific setting of σ-outer and σ-inner may be referred to hereinafter as an annular illumination mode. Controlling the spatial intensity distribution at a pupil plane of the illumination system can be done to improve the processing parameters when an image of the illuminated object is projected onto a substrate.

Microchip fabrication involves the control of tolerances of a space or a width between devices and interconnecting lines, or between features, and/or between elements of a feature such as, for example, two edges of a feature. In particular the control of space tolerance of the smallest of such spaces permitted in the fabrication of the device or IC layer is of importance. Said smallest space and/or smallest width is referred to as the critical dimension ("CD").

With conventional projection lithographic techniques it is well known that an occurrence of a variance in CD for isolated features and dense features may limit the process latitude (i.e., the available depth of focus in combination with the allowed amount of residual error in the dose of exposure of irradiated target portions for a given tolerance on CD). This problem arises because features on the mask having the same nominal critical dimensions will print differently depending on their pitch on the mask (i.e., the separation between adjacent features) due to pitch dependent diffraction effects. Pitch is the sum of the feature width and the space between two subsequent features.

A difference in printed CD between two similar features such as lines arranged at two respective, different pitches, is referred to as an iso-dense bias or "IDB". For example, a feature consisting of a line having a particular line width and arranged at a large pitch, will print differently from the same feature having the same line width and provided in a dense arrangement on the mask, i.e., arranged at a small pitch. Hence, when both dense and isolated features of critical dimension are to be printed simultaneously, a pitch dependent variation of printed CD is observed. Data describing a specific CD-pitch dependency are generally represented by a plot of CD versus pitch, referred to as a CD-pitch curve hereinafter. The phenomenon "iso-dense bias" is a particular problem in photolithographic techniques. Iso-dense bias is typically measured in nanometers and represents an important metric for practical characterization of lithography processes.

Generally, a mask pattern is designed in such a way that differences in dimensions of printed isolated and dense features are minimized to some degree, by applying a size bias to certain features. Applying, to the mask pattern, a size bias to certain features such as lines is referred to as feature-biasing and, in the case of lines, as line-biasing. The actual pitch dependency of printed CD depends, however, on the specific properties of the apparatus (such as aberrations and calibrations of the lithographic apparatus in use). Therefore, even in the presence of feature bias, a residual iso-dense bias may be present. Conventional lithographic apparatus do not directly address the problem of iso-dense bias. Conventionally, it is the responsibility of the users of conventional lithographic apparatus to attempt to compensate for the iso-dense bias by either changing the apparatus optical parameters, such as the NA of the projection lens or the σ-outer and σ-inner settings, or by designing the mask in such a way that differences in dimensions of printed isolated and dense features are minimized. However, such changes of machine settings may adversely affect the process latitude.

Generally, in a high volume manufacturing site different lithographic projection apparatus are to be used for the same lithographic manufacturing process step to ensure optimal exploitation of the machines, and consequently (in view of, for example, machine-to-machine differences) a variance and/or errors in CD may occur in the manufacturing process. Generally, the actual pitch dependency of such errors and the actual CD-pitch dependency depends on the specific layout of the pattern and the features, the aberration of the projection system of the lithographic apparatus in use, the properties of the radiation sensitive layer on the substrate, and the radiation beam properties such as illumination settings, and the exposure dose of radiation energy. Therefore, given a pattern to be provided by a patterning device, and to be printed using a specific lithographic projection apparatus including a specific radiation source, one can identify data relating to iso-dense bias which are characteristic for that process, when executed on that lithographic system. In a situation where different lithographic projection apparatus (of the same type and/or of different types) are to be used for the same lithographic manufacturing process step, there is a problem of mutually matching the corresponding different CD-pitch dependencies, such as to reduce CD variations occurring in the manufacturing process.

A known technique to match a CD-pitch dependency of a machine (for a process whereby an annular illumination mode is used) to a CD-pitch dependency of another machine is—in analogy with above described techniques to compensate an iso-dense bias—to change the σ-outer and σ-inner settings, while maintaining the difference between the σ-outer and σ-inner settings (i.e., whilst maintaining the annular ring width of the illumination mode) of one of the two machines. The nominal σ-settings are chosen so as to optimize the process latitude (in particular, the depth of focus and the exposure latitude). Therefore, this approach has the disadvantage that for the machine whereby the σ-settings are changed, the process latitude is becoming smaller and may become too small for practical use.

An actual pitch dependency as described above may be varying in time. For example, due to lens heating the aberration of the projection system may vary, and or due to heating and other instabilities properties such as illumination settings, and exposure dose of radiation energy may vary in time. Therefore there is the problem of controlling and keeping within tolerance a desired CD-pitch dependency.

SUMMARY OF THE INVENTION

The present inventors have identified the following. Techniques are known to enhance the depth of focus for a projection lithographic process by manipulating the spectral distribution of radiant intensity of the projection beam. Generally, radiation used for exposure is provided by an excimer laser; for example, a KrF excimer laser operating at 248 nm wavelength or an ArF excimer laser operating at 193 nm wavelength may be used. The spectral distribution of radiant intensity provided by such lasers comprises a spectral intensity peak having a symmetric shape with respect to a peak wavelength $\lambda_p$. The bandwidth of the spectral peak may be expressed as a full-width half-maximum bandwidth (referred to as FWHM bandwidth) or alternatively as the bandwidth within which 95% of the total output power of the laser is contained (referred to as the E95 bandwidth), with the peak wavelength $\lambda_p$ typically centered within said bandwidths.

The finite magnitude of the bandwidth introduces a "smear out" of the image of a feature over a focus range around a best focus position BF. Said smear out is represented by a plurality of images displaced along the optical axis of the projection system, in accordance with a plurality of radiation wavelengths (in a range of wavelengths centered at $\lambda_p$). The plurality of axially displaced images is formed by the projection system due to the presence of residual axial chromatic aberration of the projection system. If F is the distance between the plane of best focus corresponding to the radiation wavelength $\lambda_p$ and an image plane corresponding to the radiation wavelength $\lambda$, the effect of axial chromatic aberration is described by $dF/d\lambda=\lambda C$, where AC is a constant. Therefore, to a good approximation the effect of a constant defocus of the substrate over a distance F, during exposure, is the same as the effect of a change of wavelength $\Delta\lambda$ given by $\Delta\lambda=F/AC$ and exposing with radiation of this changed wavelength with the substrate held in the best-focus focal plane.

The effects of finite spectral bandwidth of the laser radiation can be modeled by linearly converting a symmetric laser spectral distribution of exposure intensity into a symmetric focus distribution using the lens property AC defined by $dF/d\lambda=AC$. Over a fairly wide range of wavelengths the laser spectrum can be converted linearly into a focus spectrum using this lens dependency $dF/d\lambda$ (see FIG. 1a U.S. Patent Application Publication No. 2002/0048288 A1).

A finite laser bandwidth results in the re-distribution of the aerial image through focus. The total aerial image will be a sum of the aerial images, each aerial image defocused in accordance with $F=AC\ \Delta\lambda$, and weighted by the relative exposure intensity at the wavelength $\lambda=\lambda_p+\Delta\lambda$.

This addition of (generally defocused) images has an effect on the image contrast at wafer level. Therefore, laser bandwidth contributes to the optical proximity effects and the CD-pitch dependency of a system. The laser bandwidth can vary from system to system. As a result the proximity behavior and the CD-pitch dependency can differ from system to system resulting in a proximity-behavior mismatch between different apparatus or between an actual and a target CD-pitch dependency.

It is an object of the present invention to obviate or mitigate one or more of the aforementioned problems in the prior art. In particular, it is an object of the invention to provide improved control over an iso-dense bias, both in magnitude as well as over time.

According to an aspect of the invention there is provided a lithographic apparatus comprising:

a radiation system for providing a beam of electro-magnetic radiation having a spectral distribution of radiant intensity $I(\lambda)$, a support structure for supporting a patterning device, the patterning device serving to impart the beam of radiation with a pattern in its cross-section;

a substrate table for holding a substrate, a projection system for projecting the beam of radiation after it has been patterned onto a target portion of the substrate, and a controller configured and arranged to provide an adjustment of said spectral distribution of radiant intensity based on data relating to a feature arranged at a first pitch and at a second pitch in the pattern and representing a corresponding first printed size and second printed size of the feature.

The present invention provides an advantage of adjustment of the spectral distribution of radiant intensity $I(\lambda)$: using data relating to a feature-size with the feature arranged at two different pitches, such as for example data describing the CD-pitch dependency, it is possible to match system to system optical proximity behavior.

According to a further aspect of the invention, there is provided a device manufacturing method including providing a beam of electro-magnetic radiation having a spectral distribution of radiant energy, patterning the beam of radiation with a pattern in its cross-section using a patterning device, projecting the patterned beam of radiation onto a target portion of a substrate, and adjusting of said spectral distribution of radiant intensity in accordance with data relating to a feature arranged at a first pitch and at a second pitch in the pattern and representing a corresponding first printed size and second printed size of the feature.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
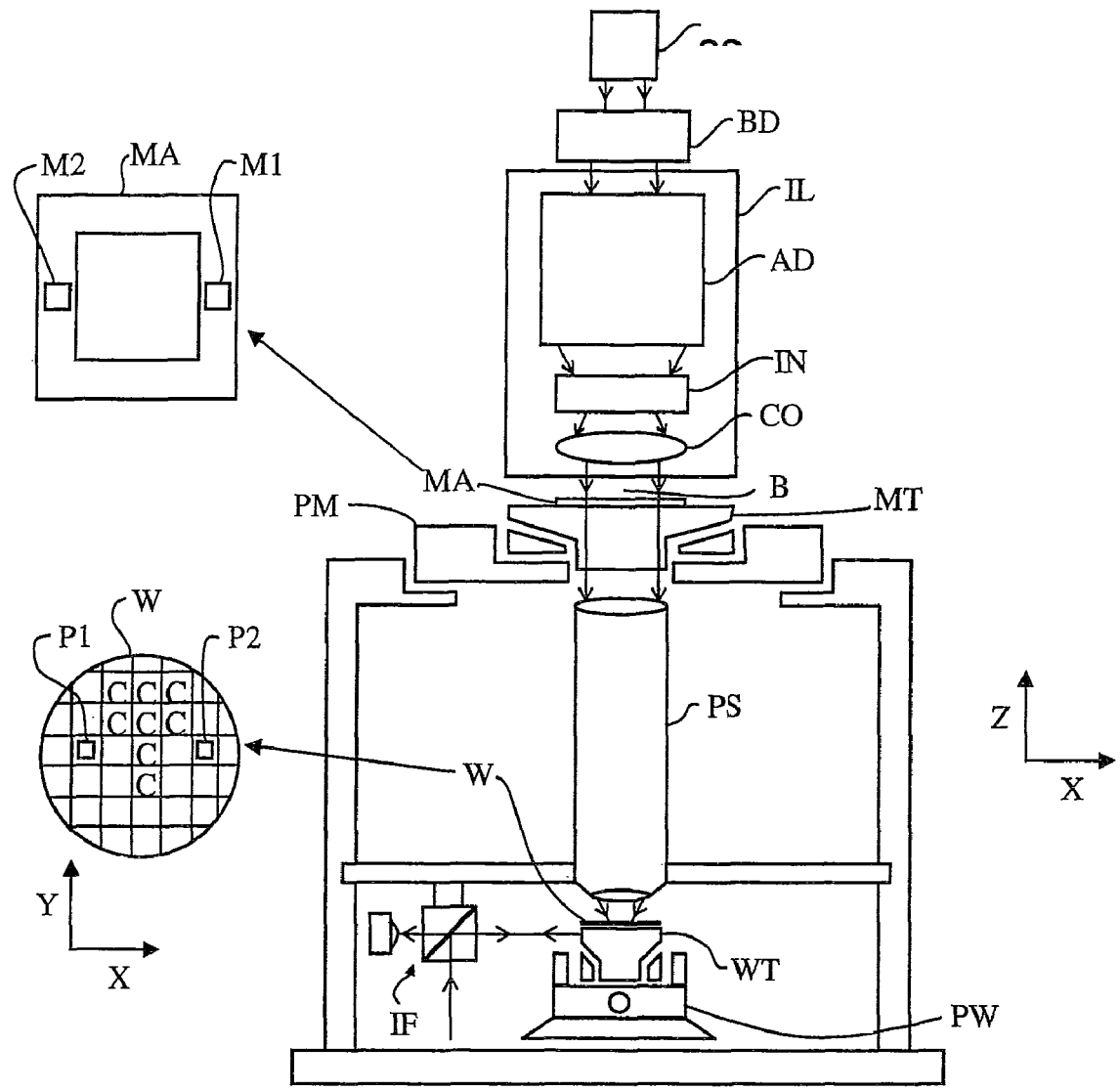
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g., UV radiation or EUV radiation).
- a first support structure (e.g., a mask table) MT for supporting a patterning device (e.g., a mask) MA and connected to first positioning actuator PM for accurately positioning the patterning device with respect to item PL;
- a substrate table (e.g., a wafer table) WT for holding a substrate (e.g., a resist-coated wafer) W and connected to second positioning actuator PW for accurately positioning the substrate with respect to item PL; and
- a projection system (e.g., a refractive projection lens) PL for imaging a pattern imparted to the projection beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning actuator PW and position sensor IF (e.g., an interferometric device), the substrate table WT can be moved accurately, e.g., so as to position different target portions C in the path of the beam PB. Similarly, the first positioning actuator PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning actuator PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes, for example:

In step mode, the mask table MT and the substrate table WT are kept essentially stationary, while an entire pattern imparted to the projection beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
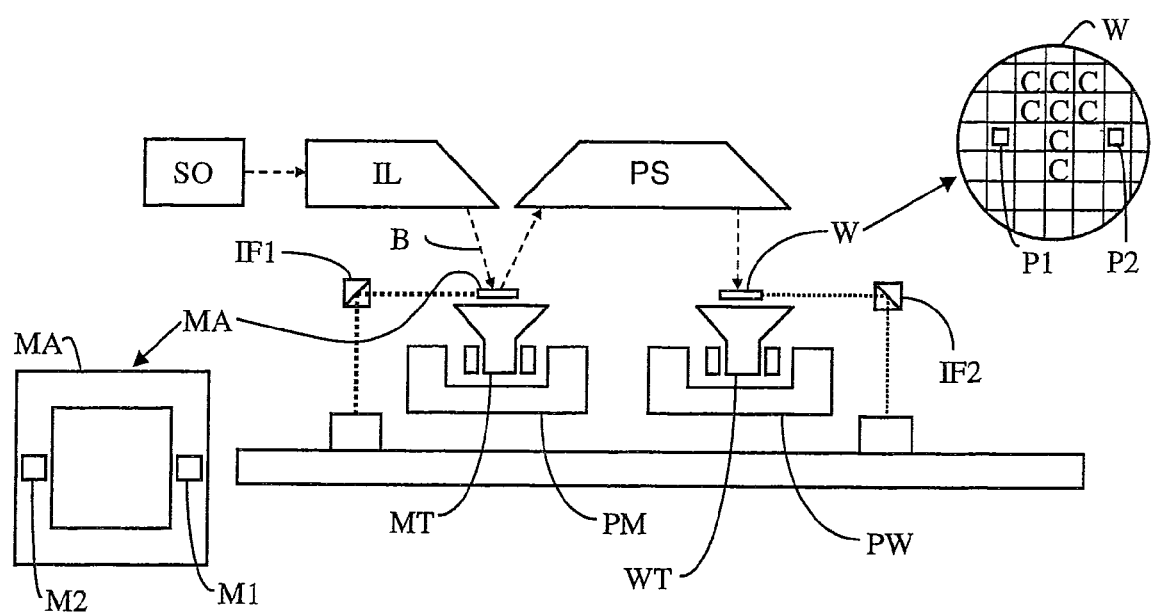
FIG. 2 depicts a lithographic apparatus according to a further embodiment of the invention.

FIG. 2 schematically depicts a lithographic apparatus according to one embodiment of the invention. The apparatus of FIG. 2, in contrast to the apparatus in FIG. 1, is of a reflective type (e.g., employing a reflective mask).

The apparatus of FIG. 2 comprises:

- an illumination system (illuminator) IL configured to condition a radiation beam B (e.g., UV radiation or EUV radiation);
- a support structure (e.g., a mask table) MT constructed to support a patterning device (e.g., a mask) MA and connected to a first positioner PM configured to accurately position the patterning device in accordance with certain parameters;
- a projection system (e.g., a refractive projection lens system) PS configured to project a pattern imparted to the radiation beam B by patterning device MA onto a target portion C (e.g., comprising one or more dies) of the substrate W.

A difference between the spectral bandwidth of lasers which are part of respective lithographic projection apparatus result in differences between a pitch dependent variation of printed CD for these respective apparatus. Thus, a difference between the respective CD-pitch dependencies may occur. The present invention seeks to address this problem by providing an apparatus which is equipped with a controller configured and arranged to provide an adjustment of the spectral distribution of the laser radiation whereby the adjustment is aimed at affecting the CD-pitch dependency of the lithographic apparatus. The adjustment may be a dynamic adjustment to compensate for variations in time of an iso-dense bias. Such variations in time may, for example, be caused by lens heating due to absorption of laser beam radiation during exposure. The CD-pitch dependency is specific for the apparatus in combination with the layout of the mask pattern and other process parameters and properties such as for example the illumination mode and setting, the exposure time, the resist type, the specific lens aberrations, as well as settings for the pre-exposure and post exposure processing steps.

As explained above, a CD-pitch dependency can be affected, according to the present invention, by adjusting the spectral intensity distribution of the laser beam. An excimer laser generally is provided with means to control and adjust the spectral distribution of the emitted laser radiation. For example U.S. Patent Application Publication No. 2002/0048288A1 relates to an excimer laser provided with a controller of a line-narrowing device for controlling a the spectral distribution of the laser beam. The controller is arranged to adjust the bandwidth of the spectral distribution by dithering a wavelength tuning mirror in phase with the repetition rate of the laser. The line narrowing unit comprises a grating and a fast tuning mechanism, and the controller controls a monitoring of the laser beam to determine bandwidth of individual pulses laser pulses, and a periodically adjusting of the tuning mechanism during a series of pulses so that the wavelengths of some pulses in the series of pulses are slightly longer than a target wavelength and the wavelengths of some pulses in the series of pulses are slightly shorter than the target wavelength in order to produce for the series of pulses an effective laser beam spectrum having at least two spectral peaks. In the latter case, the spectral distribution of radiant intensity may for example be a superposition of a first and a second peaked spectral intensity distribution having a respective equal first and second full-width half-maximum bandwidth, and a respective equal first and second intensity. The spectral peaks feature a respective first and second peak wavelength, and the difference $\Delta\lambda_p$ between the first and second peak wavelength is adjustable.

Similarly, U.S. Pat. No. 5,303,002 relates to an excimer laser which generates a beam of radiation whereby the spectral distribution of radiant intensity of the laser beam of radiation comprises a plurality of narrow spectral bands of radiation. A line narrowing device is arranged to select one or more line narrowed outputs to be used for the lithographic process. Each of the outputs may have an attenuator which can adjust the intensity of each spectral band independently. The corresponding radiation beams pass through a gain generator and are combined to produce a beam of radiation with the desired spectral distribution.

The modified spectral intensity distribution may be an asymmetric distribution, i.e. a distribution with a spectral shape deviating from a symmetric shape with respect to a center wavelength $\lambda_c$.

Figure 3A:
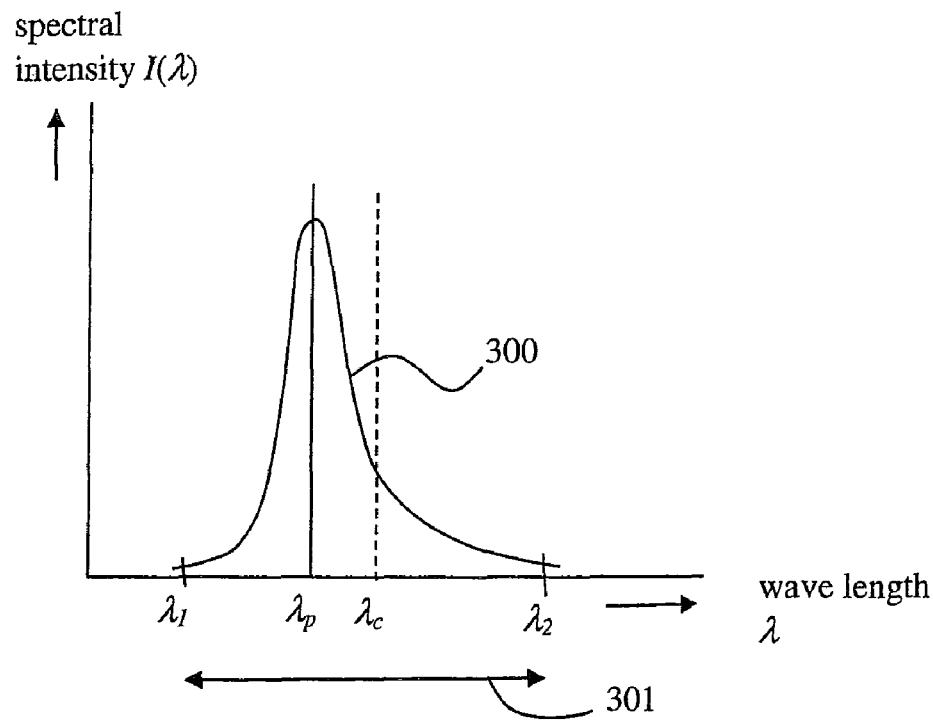
FIG. 3(a) illustrates an example of an asymmetric spectral intensity distribution with a location of a peak wavelength, a center wavelength, and E95 wavelengths.

Referring to FIG. 3(a), there is shown an example of an asymmetric spectral distribution 300. The wavelengths $\lambda_1$ and $\lambda_2$ in FIG. 3(a) define the E95 bandwidth represented by the arrow 301. The wavelength $\lambda_c$ is the center wave length, i.e. the wavelength at the center of the range $[\lambda_1, \lambda_2]$. The curve 300 represents the spectral intensity distribution $I(\lambda)$, which is peaked at a peak wavelength $\lambda_p$. In general, an asymmetric intensity distribution is characterized by the inequality $I(\lambda - \lambda_c) \neq I(\lambda_c - \lambda)$. A measure for asymmetry may be expressed in terms of the moments of intensity $MI_{left}$ and $MI_{right}$ defined as $$MI_{left} = \int_{\lambda_1}^{\lambda_c} \lambda \times I(\lambda) d\lambda \qquad (1)$$

and $$MI_{right} = \int_{\lambda_c}^{\lambda_2} \lambda \times I(\lambda) d\lambda,$$

and the spectrum may be referred to as asymmetric when $MI_{left}$ is different from $MI_{right}$. For example, the spectrum may be referred to as asymmetric when the spectral intensity distribution $I(\lambda)$ is an asymmetric distribution whereby the moments of intensity, as defined in equation (1), satisfy the inequality $$1.05 \leq \frac{|MI_{left}|}{|MI_{right}|},$$

or $$0.95 \geq \frac{|MI_{left}|}{|MI_{right}|}.$$

Figure 3B:
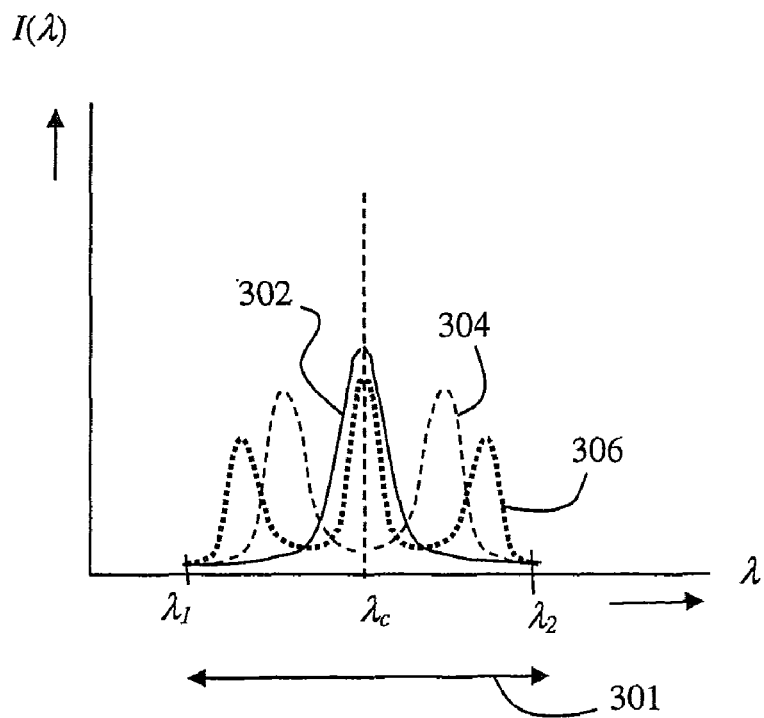
FIG. 3(b) illustrates examples of symmetric spectral intensity distributions.

FIG. 3(b) shows an example of symmetric spectral radiation distributions 302, 304 and 306.

Figure 3C:
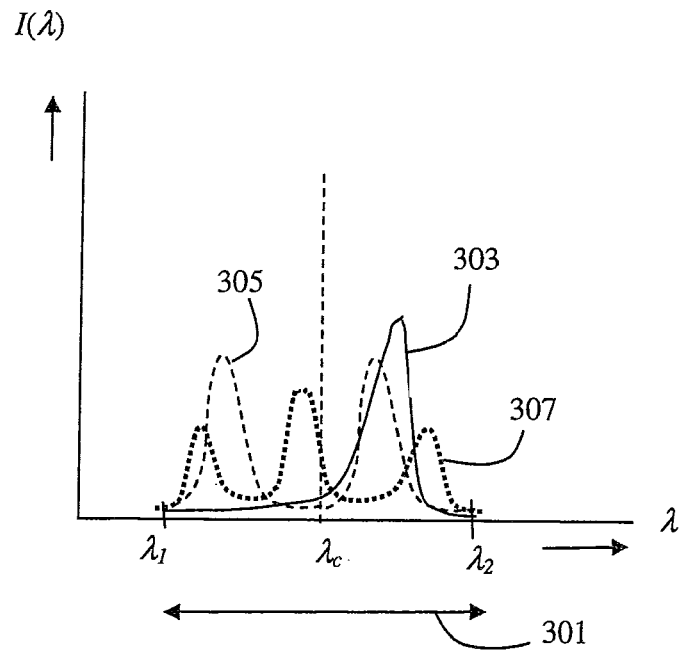
FIG. 3(c) examples of asymmetric spectral intensity distributions.

FIG. 3(c) shows an example of asymmetric spectral radiation distributions 303, 305 and 307.

Figure 4:
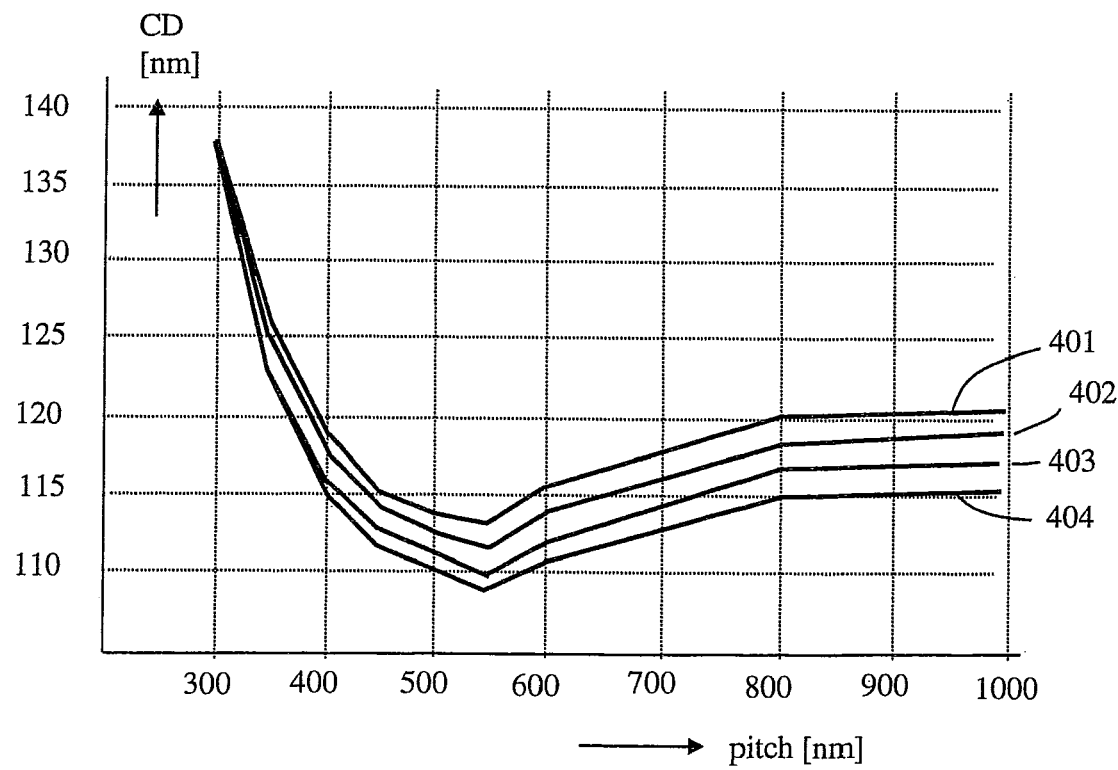
FIG. 4 illustrates four CD-pitch curves for four different spectral bandwidths.

FIG. 4 illustrates several CD-pitch curves obtained by simulation of a lithographic process. Each of the simulated CD-against-pitch curves relates to a line feature occurring at different pitches. The line width to be printed is 150 nm; the corresponding pitch of a 1:1 duty cycle dense pattern of these lines is 300 nm. The spectral distribution of laser radiation is symmetric, and the CD-pitch curves 402, 403, and 404 are parameterized by the E95 bandwidth of the spectral peak. The plot 401 represents the iso-dens bias characteristic for the ideal case whereby the laser radiation is monochromatic. The CD-pitch curves 402, 403, and 404 represent the CD versus pitch behaviour of the lithographic process for respectively an E95 bandwidth of 0.52 pm, 0.8 pm, and 1.2 pm. Whereas at 300 nm pitch a variation of laser bandwidth has practically no effect, the printed line width (CD) for lines arranged at, for example 800 nm pitch is dependent on the laser bandwidth.

According to the present invention, the line biasing at the mask may for example be chosen such as to compensate the variations of IDB characteristic 403. Lines at a pitch of 300 nm are line-biased with 17 nm and lines arranged at 800 nm are line-biased 35 nm, in order to obtain equal printed line width of 150 nm (printed CD) for both pitches.

However, since line width variations can be caused by a multitude of errors such as focus and dose variations, exposure tool imperfections such as a value variations, projection lens aberrations, or flare, a residual iso-dense bias error may occur in spite of using above described feature biased mask pattern for exposure. This residual iso-dense bias may either be predicted using apparatus data and a computer-simulation of the lithographic process, or, alternatively, may be measured by running a calibration measurement. In both ways, data relating to the line-feature arranged at a first pitch (for example, 300 nm) and at a second pitch (for example, 800 nm) in the pattern and representing the corresponding first printed line width and second printed line width of the line-feature can be obtained.

A deviation at 300 nm pitch of the printed line width may, for example, be compensated by adjusting the exposure dose. The data obtained may be corrected for this exposure dose adjustment. As a result, the expected printed CD at 800 nm pitch may then be 1.5 or 2 nanometer too small (when, for example, the apparatus and process in use is characterized by plot 404). From the behaviour of CD as a function of laser spectral bandwidth at 800 nm pitch, an adjustment of the spectral distribution of radiant intensity based on the data (and corrected for exposure dose adjustment in this example) may be applied in accordance with the characteristics 404 and 403: a decrease of the bandwidth by 0.3 pm will lead to an increase of line width at 800 nm pitch by 1.5 to 2 nm, without affecting the line width at 300 nm pitch.

Alternatively, the expected printed line width at 800 nm pitch may be 2 nanometer too big (for example, the apparatus and process in use is characterized by plot 302), in which case an adjustment of the spectral distribution of radiant intensity based on the data (and corrected for exposure dose adjustment) may be applied in accordance with the characteristics 402 and 403: an increase of the bandwidth by 0.4 pm will lead to a decrease of line width at 800 nm pitch by about 2 nm, again without substantially affecting the line width at 300 nm pitch. According to the present invention, an adjustment of the laser spectral intensity distribution can be used as described above to provide an adjustment of a CD-pitch dependency. Such an adjustment can be used to reduce optical proximity effects or residual optical proximity effects in a lithographic printing process, or to reduce differences between different CD-pitch dependencies of different apparatus.

According to an aspect of the invention, the adjustment described above is obtained using an excimer laser whereby the spectral distribution of radiant intensity is a superposition of two equal but spectrally disclaced, peaked spectral intensity distributions having an equal first and second full-width half-maximum bandwidth, and a respective equal first and second intensity, and whereby the difference $\Delta\lambda_p$, between the first and second peak wavelength is adjustable in a range from 0 to 0.5 pm and more particularly from 0 to 1 pm. With these ranges, and with typical axial chromatic aberration (absolute) values for the coefficient AC, such as for example in a range from 150 nm/pm to 400 nm/pm, smear out of the image covers a range of about −400 to +400 nm around best focus which is a practical range for adjusting or matching an iso-dense bias.

According to an aspect of the invention the source SO in FIG. 1 is an excimer laser providing a pulsed beam of laser radiation. The laser comprises bandwidth monitoring equipment and wavelength tuning equipment permitting bandwidth control of the laser beam by a bandwidth-controller of the laser. The bandwidth-controller of the laser is generally used to maintain a preselected bandwidth (compensating, for example, changes in the laser-gain medium over the life of the laser), in accordance with a selection made by the laser manufacturer. According to the present invention, however, the bandwidth-controller of the laser is provided with an input channel arranged for receiving a signal representative for a selected bandwidth of the spectral distribution in accordance with a selection made by the user of the laser. For example, the signal can be provided by the controller of the lithographic apparatus according to the present invention. With an eximer laser featuring a user-selectable spectral bandwidth the adjustmet of iso-dense bias according to the present invention can be provided dynamically, for example, during a sanning exposure of a target portion C or during a plurality of exposures of target portions C covering a substrate. Both intra-die and inter die controll of iso-dense bias is obtained this way. Similarly, an eximer laser provided with user-selectable spectral bandwidth setting can be used to obtain iso-dense bias matching between different apparatus, in accordance with the present invention.

Figure 5:
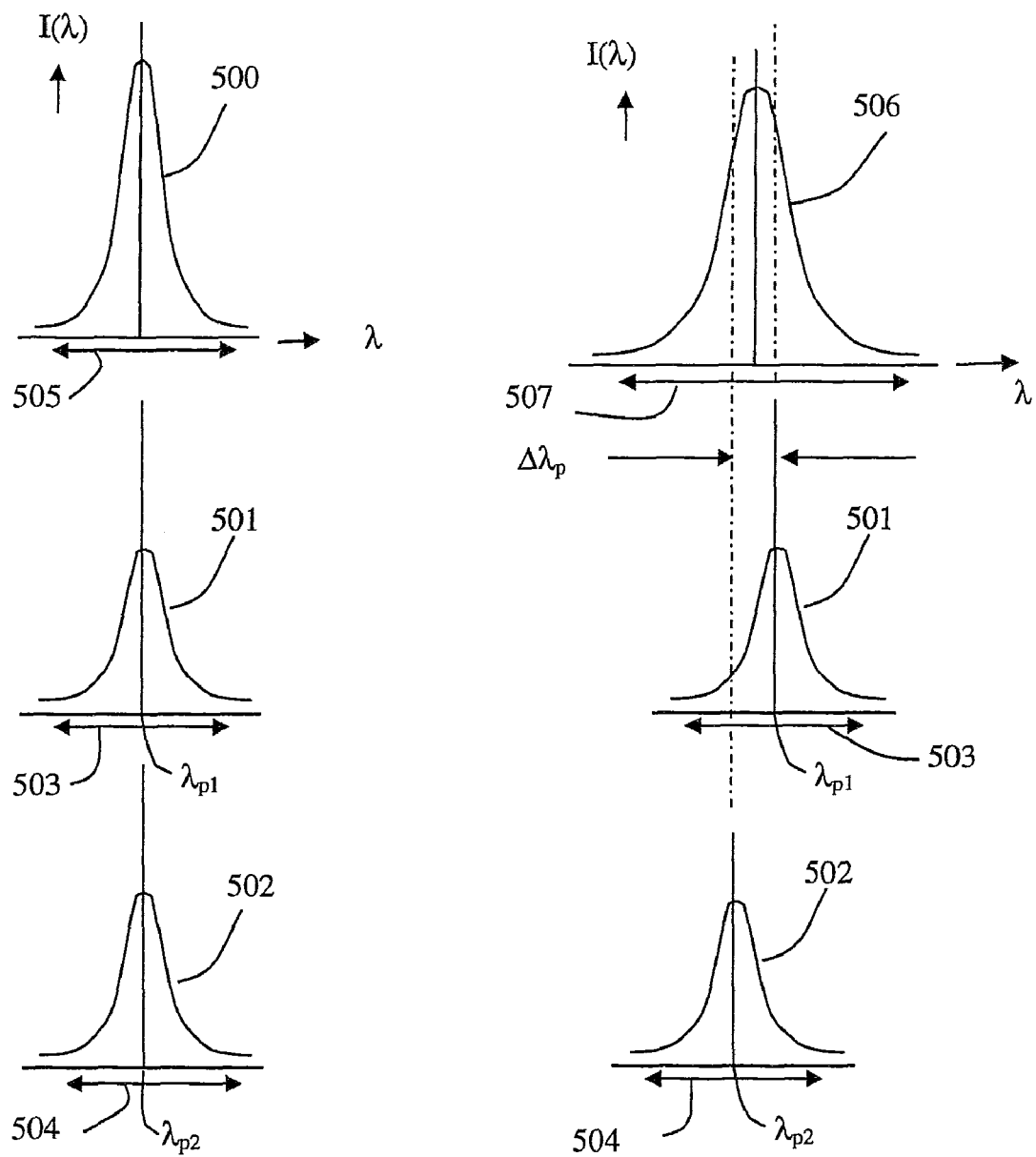
FIG. 5 illustrates a symmetric spectral intensity distribution as a superposition of two spectrally overlapping intensity distributions and as a superposition of two mutually displaced spectral intensity distributions.

FIG. 5 illustrates a spectral distribution of radiant intensity 500 as a superposition of a first peaked spectral intensity distribution 501 and a second peaked spectral intensity distribution 502 having a respective equal first bandwidth 503 and second bandwidth 504. The respective first and second peak intensities as well as the first and second peak wavelengths $\lambda_{p1}$ and $\lambda_{p2}$ are equal. FIG. 5 further illustrates the effect of providing, through control of the line width narrowing device of the pulsed excimer laser, an adjustment comprising a change $\Delta\lambda_p$ of the difference between the first and second peak wavelength. The adjustment is (the difference $\lambda_{p1}-\lambda_{p2}$ in FIG. 5 being initially zero) in the present example equal to the difference $\lambda_{p2}-\lambda_{p1}$. The resulting intensity distribution 506 has a bandwidth 507 larger than the initial bandwidth 505.

Figure 6:
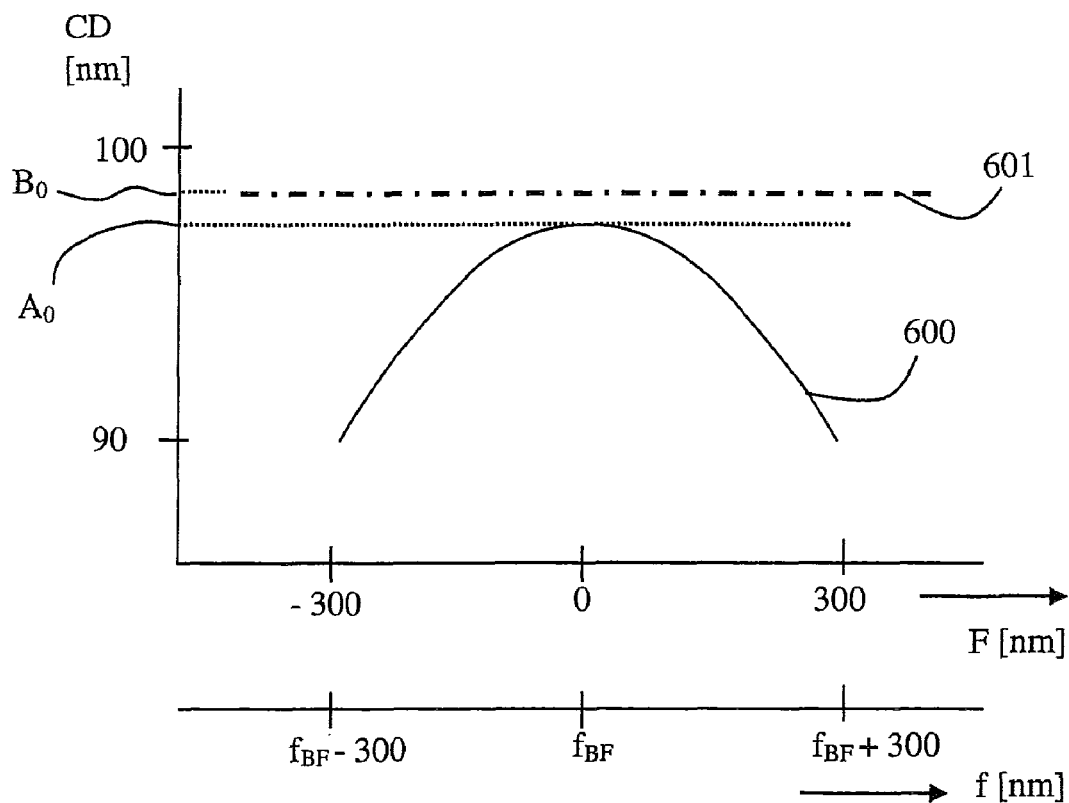
FIG. 6 shows a schematic representation of Bossung curves for dense and isolated features.

Referring to FIG. 6 there is shown a schematic representation of a Bossung curve 600 typical for an isolated feature and a Bossung curve 601 typical for the feature in dense arrangement, i.e., arranged at a duty cycle 1:1. The Bossung curve 600 represents a plot of printed critical dimension for the feature in isolated arrangement, and the corresponding CD is denoted by $CD_{iso}$, as it would be obtained with exposure in different focal positions. The exposure energy is a constant along the plots 600 and 601. The different focal positions are given by the focal coordinate F (above referred to as a "defocus"), which defines the position of the substrate with respect to a position of best focus BF.

Typically, the printed critical dimension $CD_{dense}$ of the dense feature does not depend (to a first approximation) on focal position, because of the extended depth of focus resulting from two beam imaging. Generally, imaging of dense features is arranged such that only two diffracted orders of radiation, as emerging from the pattern, are captured by the imaging projection lens.

The printed critical dimension $CD_{iso}$ may be modelled as a polynomial of F according to $$CD_{iso}=A_0+A_1F+A_2F^2+A_4F^4, \quad (2)$$

whereby the coefficient $A_0$ represents the printed CD at best focus. Further, the coordinate F may be expressed in terms of an absolute focus coordinate f defined by $F=f-f_{BF}$, where the coordinate $f_{BF}$ is the absolute coordinate, along the z-axis, of the best focus position BF.

In the absence of a so-called linear focus term, i.e. when $A_1=0$, the resulting second order approximation denoted by $CD_{iso}$ (0,2; f) of $CD_{iso}$ is then given by $$CD_{iso}(0,2;f)=A_0+A_2(f-f_{BF})^2. \quad (3)$$

In contrast, the Bossung curve for the dense feature may simply be modeled as $CD_{dense}=B_0$. Thus, at best focus BF, the dense features are printed at a width $B_0$, and the isolated features at a width $A_0$, and the iso-dense bias between thee features would be $A_0-B_0$ nm.

In accordance with the present invention, the effects of finite spectral bandwidth on the Bossung curve can be modeled by linearly converting a symmetric spectral intensity distribution of the laser beam into a symmetric focus distribution using the lens property AC defined by $dF/d\lambda=AC$. Since $F=f-f_{BF}$, also $df/d\lambda=AC$ at or near best focus position. The laser bandwidth results in the re-distribution of the aerial image through focus. The total aerial image will be a sum of the aerial images, each aerial image defocused in accordance with $F=AC\ \Delta\lambda$, and weighted by the relative exposure intensity at each wavelength $\lambda$. The weighting may be expressed by a weight-function W in accordance with the spectral distribution of radiant intensity I(λ) of the laser radiation.

The resulting printed CD incorporating the effect of the addition of the (generally defocused) images may be represented by $CD_{av}$, and can be approximated by the following averaging:

$$CD_{av}(f) = \frac{\int_{f-\frac{1}{2}F_{BW}}^{f+\frac{1}{2}F_{BW}} CD_{iso}(f')W(f'-f)\,df'}{\int_{f-\frac{1}{2}F_{BW}}^{f+\frac{1}{2}F_{BW}} W(f'-f)\,df'}, \quad (4)$$

where the "bandwidth" $F_{BW}$ represents the focus range equivalent to the bandwidth of the spectral intensity distribution. For example, with $\lambda_1$ and $\lambda_2$ being the E95 bandwidth wavelengths, $F_{BW}$ can be defined as $F_{BW}=AC(\lambda_1-\lambda_2)$. The weight function W(f) is proportional to the spectral distribution of radiant intensity I(λ) and can be obtained from I(λ) by expressing I(λ) as a function of $(\lambda-\lambda_c)$, and writing $\lambda-\lambda_c$ as an equivalent focal coordinate f with $(\lambda-\lambda_c)=f/AC$, in view of the lens property df/dλ=AC.

Figure 7:
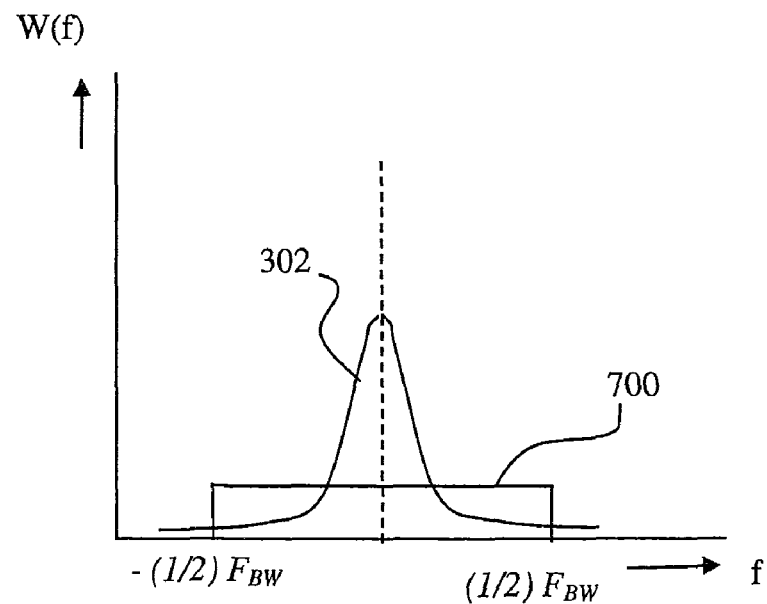
FIG. 7 illustrates a symmetric spectral intensity distribution and a weight factor representing the intensity distribution.

For simplicity it will be assumed that the weight function W(f) in accordance with the symmetric intensity distribution 302 of FIG. 3 can be approached by a block function 700, as illustrated in FIG. 7.

Combination of this approximation with the approximation $CD_{iso}$ (0,2; f) for the printed CD of an isolated feature, results in the following prediction for the average CD (at best focus) of a feature due to the introduction of a finite laser bandwidth (resulting in the re-distribution of the aerial image over a focus range of from $-\frac{1}{2}F_{BW}$ to $\frac{1}{2}F_{BW}$):

$$CD_{av}(f_{BF}) = \frac{\int_{f_{BF}-\frac{1}{2}F_{BW}}^{f_{BF}+\frac{1}{2}F_{BW}} CD_{iso}(0,2;f')\,df'}{\int_{f_{BF}-\frac{1}{2}F_{BW}}^{f_{BF}+\frac{1}{2}F_{BW}} df'}, \quad (5)$$

$$= A_0 + \frac{1}{12}A_2 F_{BW}^2$$

From the above equation it is clear that the change $\Delta CD_{iso}$ in printed critical dimension at best focus (due to a change from ideal monochromatic radiation to the introduction of a certain laser bandwidth resulting in a through focus re-distribution of the image over a focus range from $-\frac{1}{2}F_{BW}$ to $\frac{1}{2}F_{BW}$) is given by $$\Delta CD_{iso} = A_2 \cdot \frac{1}{12}F_{BW}^2 \sim F_{BW}^2$$

In contrast, no such change occurs for the size of the dense features, since in the present approximation $CD_{dense}$ is a constant value, independent of focus position: $CD_{dense}=B_0$, in accordance with the iso-dense characteristics as illustrated in FIG. 4.

Figure 8:
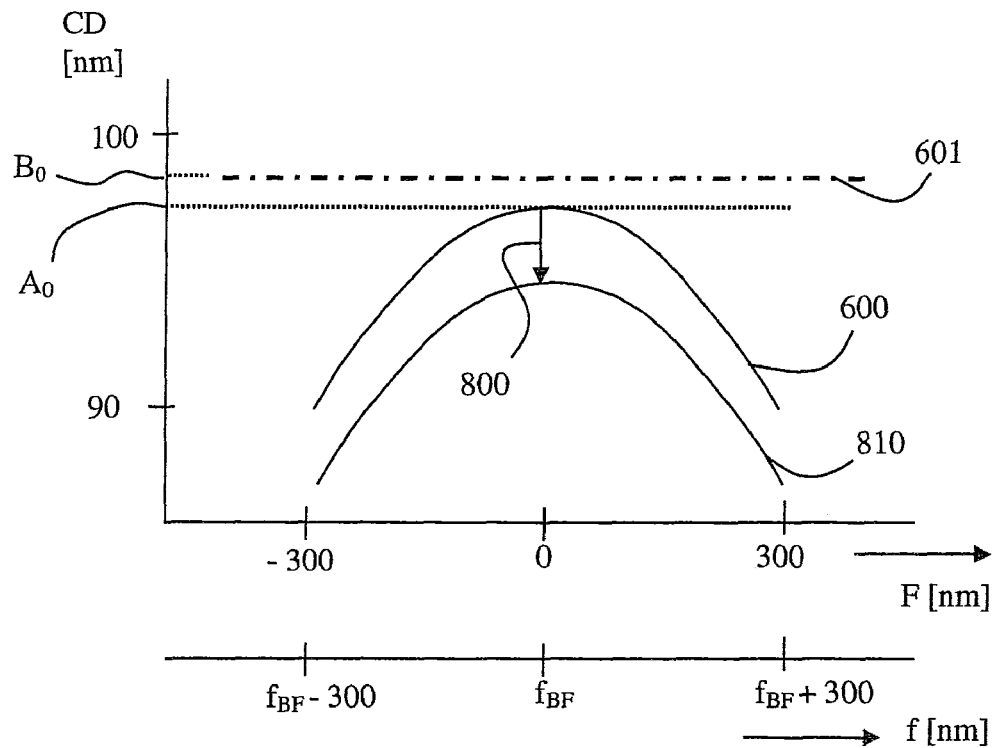
FIG. 8 shows an example of Bossung curves for dense and isolated features, and the effect of an increase of spectral bandwidth.

FIG. 8 schematically illustrates the effect of the change from an ideal practically monochromatic radiation spectrum of the laser beam to the introduction of a finite laser bandwidth in accordance with the present approximation. The arrow 800 represents the (focus independent) shift $\Delta CD_{iso}$ of the Bossung curve 600 representing the printed CD as obtained with the exposure process using a practically monochromatic (not bandwidth broadened) laser radiation spectrum, and the curve 810 is the Bossung curve for the increased laser bandwidth. Since generally the Bossung curve for the feature in dense arrangement is less or not sensitive to a change of spectral bandwidth, the adjustment of spectral bandwidth can be used for adjusting the CD-pitch dependency.

Assuming that the energy dependence of the CD is focus independent an undesired residual impact of laser bandwidth on printed CD could be easily compensated in order to maintain the CD of a reference feature (such as for example the dense lines in the present embodiment) unaltered.

The same approximation as described above can be generalized for an arbitrary defocus position F (and using $F=f-f_{BF}$) as follows:

$$CD_{av}(F) = \frac{\int_{F+f_{BF}-\frac{1}{2}F_{BW}}^{F+f_{BF}+\frac{1}{2}F_{BW}} CD_{iso}(0,2;f')\,df'}{\int_{F+f_{BF}-\frac{1}{2}F_{BW}}^{F+f_{BF}+\frac{1}{2}F_{BW}} df'}, \quad (6)$$

$$= A_0 + A_2 F^2 + \frac{1}{12}A_2 F_{BW}^2$$

The change in CD induced by the re-distribution of the aerial image over a focus range from $-\frac{1}{2}F_{BW}$ to $\frac{1}{2}F_{BW}$ is independent of the focus position F and is proportional with $F_{BW}^2$.

For the fourth order focus term in Equation (2) can be derived the following contribution CDav(4) to CDav:

$$CD_{av}(4,F) = \frac{\int_{F+f_{BF}-\frac{1}{2}F_{BW}}^{F+f_{BF}+\frac{1}{2}F_{BW}} A_4(f'-f_{BF})^4\,df'}{\int_{F+f_{BF}-\frac{1}{2}F_{BW}}^{F+f_{BF}+\frac{1}{2}F_{BW}} df'}. \quad (7)$$

$$= A_4\left(F^4 + \frac{1}{2}F^2 F_{BW}^2 + \frac{1}{80}F_{BW}^4\right)$$

Equation 7 shows that there is now a defocus-dependent shift as well as a constant shift of the Bossung curve.

Similarly, for a first order focus term in Equation (2) can be derived the contribution CDav(1) to CDav:

$$CD_{av}(1,F) = \frac{\int_{F+f_{BF}-\frac{1}{2}F_{BW}}^{F+f_{BF}+\frac{1}{2}F_{BW}} A_1(f'-f_{BF})\,df'}{\int_{F+f_{BF}-\frac{1}{2}F_{BW}}^{F+f_{BF}+\frac{1}{2}F_{BW}} df'} \quad (8)$$

$$= A_1 F$$

So the re-distribution of the aerial image over a focus range from $-\frac{1}{2}F_{BW}$ to $\frac{1}{2}F_{BW}$ does not impact the linear focus term.

According to an embodiment of the invention, the spectral distribution of radiant intensity comprises a spectral intensity peak having, with respect to a center wavelength, a symmetric shape and wherein said adjustment comprises a change of the symmetric shape into an asymmetric shape with respect to the center wavelength.

Figure 9:
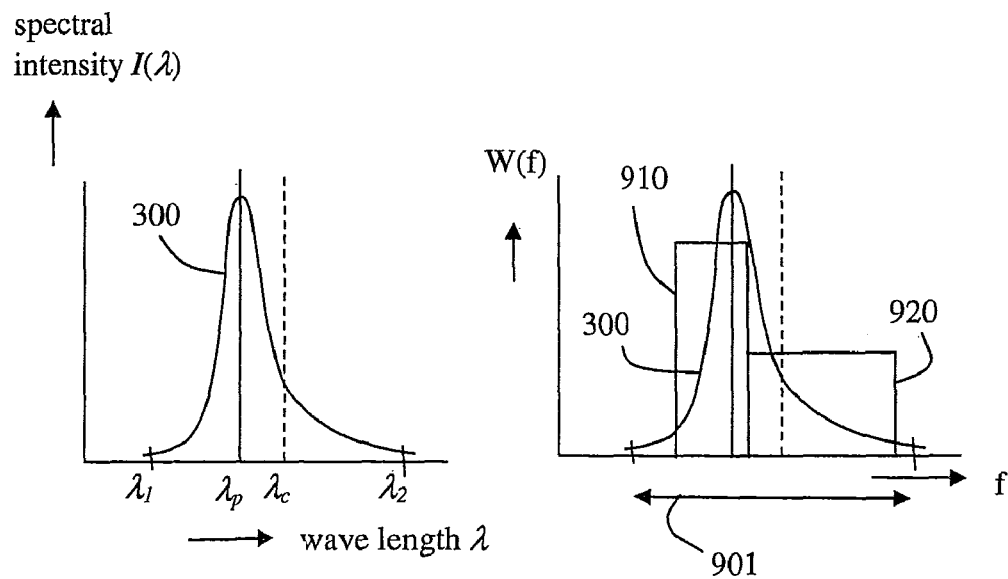
FIG. 9 illustrates an asymmetric laser spectral intensity distribution and an representative weight function consisting of two adjacent block shaped sections.

An asymmetric spectral distribution of radiant intensity of the laser beam can be provided, for example, by differently attenuating each of a plurality of narrow spectral bands of radiation in a line narrowing device which is arranged to select a plurality of line narrowed outputs to be used for the lithographic process. In FIG. 9 a asymmetric intensity distribution I(λ) is represented by the plot 300. Similar to the embodiment described above, the intensity distribution may be approximated by adjacent, block shaped intensity distributions. In particular, as is illustrated in FIG. 9, in the present embodiment the intensity distribution is modelled as two adjacent block functions 910 and 920, of equal area, and different width. The E95 wavelengths $\lambda_1$ and $\lambda_2$ define a total bandwidth equivalent to the focus range 901 with a magnitude denoted by $3/2F_{BW}$, and the spectrum is approximated by the left block function 910 of width $\frac{1}{2}F_{BW}$ and the right block function 920 of bandwidth $F_{BW}$. As described above for a symmetric intensity distribution, the present asymmetric spectral radiant intensity distribution may be converted into a weight function W(f) proportional to the spectral distribution of radiant intensity I(λ) by expressing I(λ), or in this embodiment by expressing the block functions representing I(λ)) as a function of $(\lambda - \lambda_c)$, and writing $\lambda - \lambda_c$ as an equivalent focal coordinate f with $(\lambda - \lambda_c) = f/AC$, in view of the lens property $df/d\lambda = AC$. Since the block functions 910 and 920 are of equal area, the exposure dose in the corresponding focus ranges is equal.

The effect of a change of the spectral intensity distribution which initially is representing a quasi monochromatic laser line into an asymmetric spectral intensity distribution on a Bossung curve can be estimated using the procedure as described above.

A combination of the present approximation for the intensity distribution I(λ) (resulting in to adjacent block-shaped weight functions) with the approximation $CD_{iso}$ (0,2; f) for the printed CD of an isolated feature, results in the following prediction for the average critical dimension $CD_{av}$ (at arbitrary defocus F):

$$CD_{av}(F) = \frac{1}{2} \frac{\int_{F+f_{BF}-\frac{1}{2}F_{BW}}^{F+f_{BF}} CD_{iso}(0,2; f') df'}{\int_{F+f_{BF}-\frac{1}{2}F_{BW}}^{F+f_{BF}} df'} +$$

$$\frac{1}{2} \frac{\int_{F+f_{BF}}^{F+f_{BF}+F_{BW}} CD_{iso}(0,2; f') df'}{\int_{F+f_{BF}}^{F+f_{BF}+F_{BW}} df'}$$

$$= A_0 + A_2 F^2 + \frac{1}{2} A_2 FF_{BW} + \frac{1}{4} A_2 F_{BW}^2$$

Figure 10:
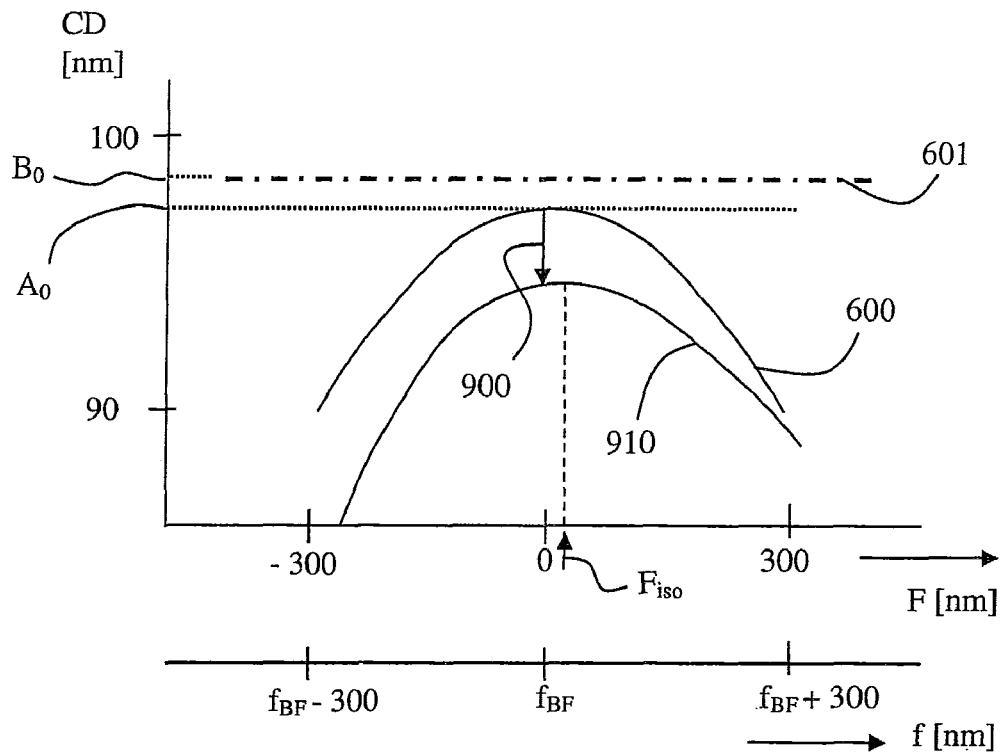
FIG. 10 shows an example of Bossung curves for dense and isolated features, and the effect of an increase of asymmetry of a spectral intensity distribution.

As schematically indicated in FIG. 10, not only an offset 900 with magnitude $\frac{1}{4}A_2 F_{BW}^2$ is introduced (similar to the situation whereby an increase of bandwidth of a symmetric spectral distribution is applied) but also a linear term $\frac{1}{2}A_2 FF_{BW}$ is introduced. The presence of these two contributions results in a shifted and tilted. Bossung curve (910), as schematically indicated in FIG. 10. Further, the focus position along the optical axis where a change of critical dimension as a function of a change of focal position is zero, is now located at a defocus position $F_{iso}$ slightly defocused from the best focus position $f_{BF}$.

Since the Bossung curve for the feature in dense arrangement again is not changing (in the present approximation), a transition from a narrow symmetric intensity distribution to an asymmetric intensity distribution could be used to adjust a CD-pitch dependency.

Figure 11:
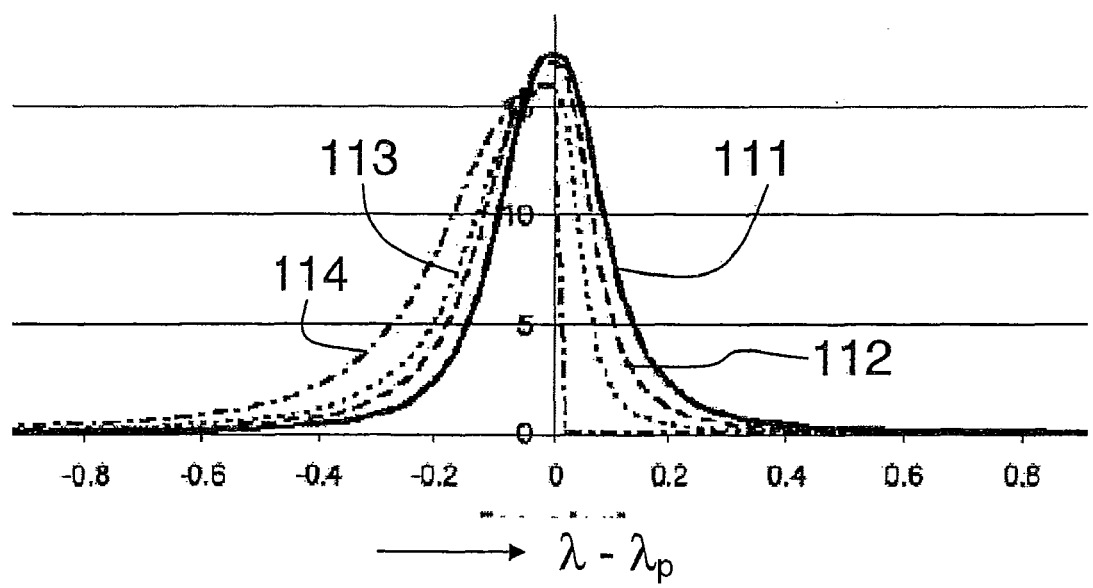
FIG. 11 illustrates four intensity distributions for use with a simulation of the effect of increased intensity distribution asymmetry at a constant FWHM (Full Width Half Maximum)
Figure 12:
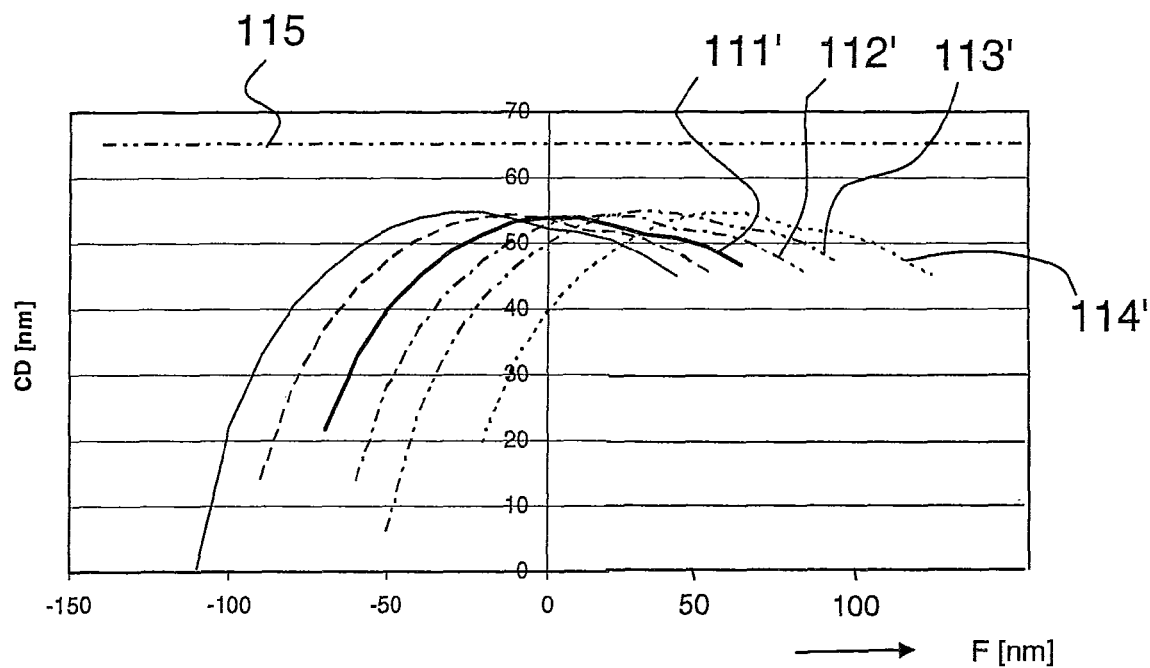
FIG. 12 shows the Bossung curves for dense and isolated features corresponding to the spectra of FIG. 11.

The impact of varying the asymmetry of a spectral intensity distribution I(λ) is shown by way of simulations and illustrated in FIG. 11 and FIG. 12. FIG. 11 shows different asymmetric spectral intensity distributions 111, 112, 113, and 114. For the simulations these spectral intensity distributions were approximated. FIG. 12 shows the simulated effect of increased spectral asymmetry for constant FWHM (Full Width Half Maximum=0.2 pm), and for nominal 65 nm dense and isolated lines (Prolith 5 pass calculation, NA 0.93 and sigma 0.94/0.74, binary reticle, calibrated resist model). The Bossung curves 111', 112', 113', and 114' correspond to the respective spectra 111, 112, 113, and 114. As expected from the calculations, the effect is a shift of the Bossung curve along the focus-axis and change of the tilt of the Bossung curve at a fixed focus. Note that all calculations were performed using the same exposure dose. Further, FIG. 12 shows that the Bossung curve 115 for dense lines is not affected by the spectral adjustment. Therefore, the adjustment can successfully be used for adjusting a CD-pitch dependency.

Figure 13:
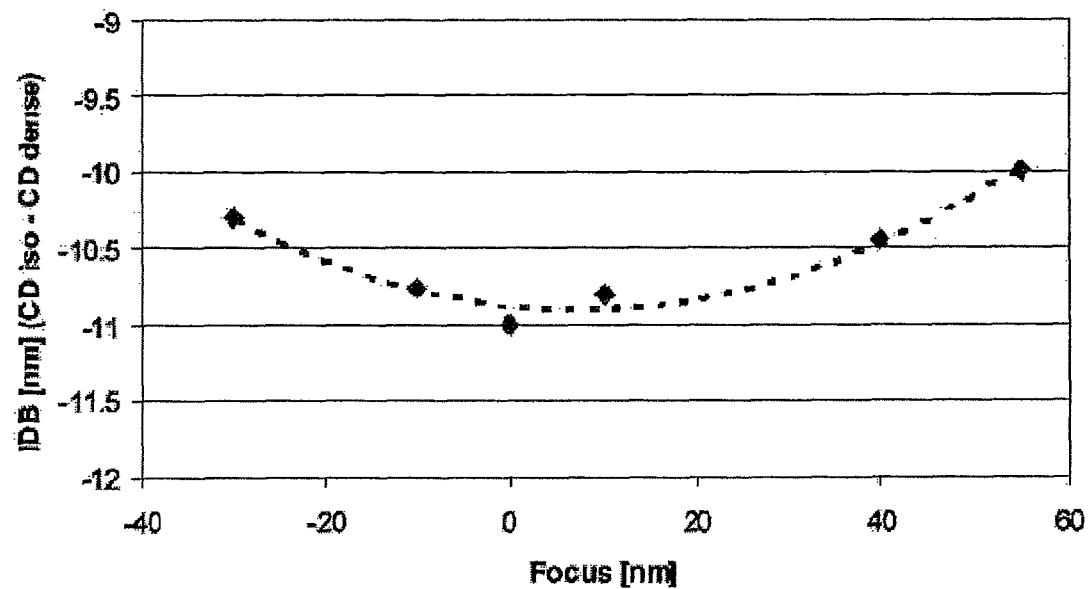
FIG. 13 depicts a simulated effect of increased asymmetry of the spectral intensity distribution at constant FWHM (Full Width Half Maximum)

FIG. 13 shows simulated effect of increased asymmetry of the laser spectral intensity distribution for constant FWHM=0.2 pm, as shown in FIG. 11, on an iso-dense bias value for nominal 65 nm dense and isolated lines. Showing the impact on iso dense bias when correcting for the focus offset introduced by the asymmetry of the spectral distribution. The magnitude of the impact is application dependent (feature size and shape, resist and illumination conditions/mode).

Figure 14:
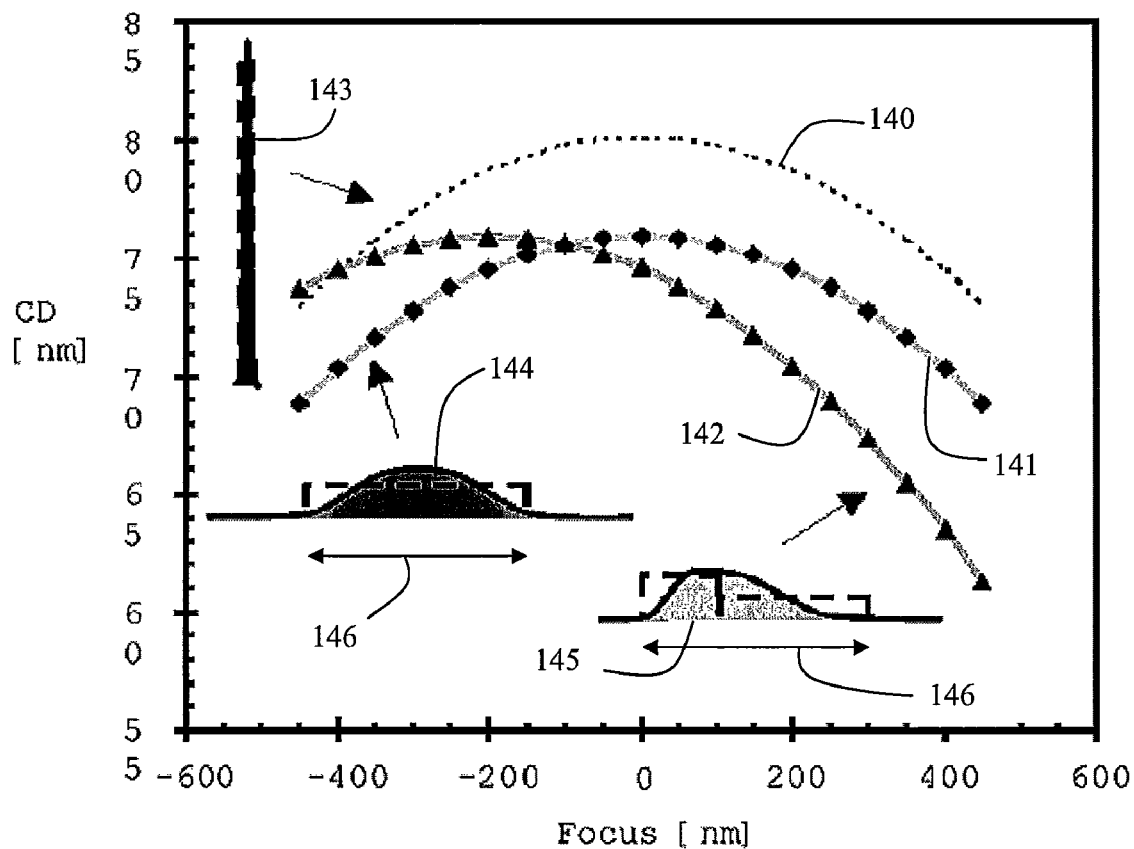
FIG. 14 schematically depicts the effect of a transition from a relatively narrow, symmetric spectral intensity distribution to a broader symmetric and to a broader asymmetric spectral intensity distribution on a Bossung curve for an isolated feature.

Referring to FIG. 14, examples of Bossung curves 140, 141, 142 show the impact of a transition from a conventional relatively narrow and symmetrical spectral intensity distribution (143) to a symmetrical bandwidth-broadened distribution (144) and to an asymmetrical spectral intensity distribution (145). The dashed lines indicate the approximation used for the weight function W(f). The Bossung curve for dense lines is not shown, and is unaffected, thereby providing two independent parameters for adjusting an iso dense bias characteristic of an apparatus. Note for both the symmetrical and asymmetrical case the total focal range 146 is the same.

Figure 15:
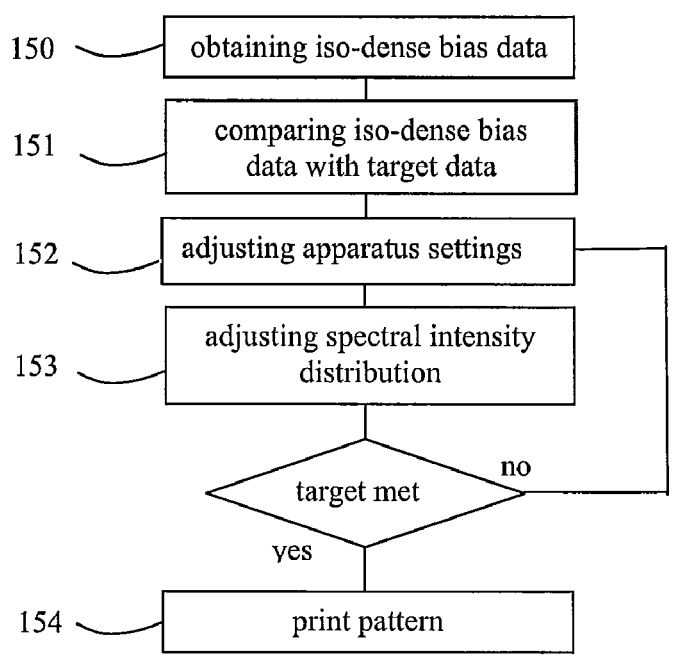
FIG. 15 depicts a flow diagram illustrating a device manufacturing method according to the invention.

According to an aspect of the present invention a device manufacturing method may exploit the possibility to adjust an iso dense characteristic by adjustment of the spectral intensity distribution of the projection beam radiation, as provided by, for example, an excimer laser, in order to keep the CD-pitch dependency within tolerance or to maintain a matching of the CD-pitch dependency to a target CD-pitch dependency. As illustrated in FIG. 15, a first step 150 of the method comprises obtaining iso-dense bias data the apparatus and the process run on the apparatus, i.e., data relating to a feature arranged at a first pitch and at a second pitch in the pattern and representing a corresponding first printed size and second printed size of the feature. Next, comparing these data with target data, step 151 in FIG. 15, yields information on the desired change of the iso-dense bias. Next, a first adjustment of the iso-dense bias is provided by adjusting a lithographic apparatus setting (such as for example an exposure dose, a sigma setting, and a setting of illumination mode parameters) such that for one pitch the features will be printed at the desired critical dimension. This first adjustment is depicted by step 152. An independent second adjustment of the iso-dense bias is next obtained by adjusting the spectral intensity distribution of the projection beam radiation, step 153. The latter step can be exploited to establish the printing of the desired critical dimension for features arranged at the second pitch. Before printing the pattern (step 154), if the obtained, adjusted iso-dense bias is not yet satisfactory, the steps 152 and 153 can be repeated until the adjusted iso-dense bias is sufficiently close to the target iso-dense bias.

While specific embodiments of the invention have been described above, it will be appreciated that the invention may be practiced otherwise than as described. The description is not intended to limit the invention. It will also be appreciated that the disclosed embodiments may include any of the features herein claimed.

The invention claimed is:

1. An excimer laser arranged to produce radiation to expose a radiation-sensitive surface of a substrate in a lithographic apparatus and having a bandwidth-controller arranged to control a bandwidth of the spectral distribution of radiant intensity of the radiation, the bandwidth-controller constructed and arranged to adjust the bandwidth in reaction to a signal, supplied by the lithographic apparatus, representative for a selected bandwidth of the spectral distribution, wherein the signal is determined based on data relating to a feature arranged at a first pitch and at a second pitch in a pattern and representing a corresponding first printed size and second printed size of the feature, the pattern being that of a patterning device used to modulate the radiation for projection onto a radiation-sensitive target portion of a substrate by a lithographic apparatus.

2. The laser according to claim 1, wherein the data represent a difference between the corresponding first printed size and second printed size of the feature.

3. The laser according to claim 2, wherein the adjustment is arranged to match the difference to a target difference, the target difference being a difference between the corresponding first printed size and second printed size of the feature, as printed using the patterning device on respectively a first lithographic apparatus and a second lithographic apparatus.

4. The laser according to claim 1, wherein the spectral distribution of radiant intensity is a superposition of a first and a second peaked spectral intensity distribution having a respective equal first and second bandwidth, and a respective equal first and second intensity, and a respective first and second peak wavelength, and wherein the adjustment comprises a change of difference between the first and second peak wavelength.

5. The laser according to claim 1, wherein the spectral distribution of radiant intensity comprises a spectral intensity peak having, with respect to a center wavelength, a symmetric shape and wherein the adjustment comprises a change of the symmetric shape into an asymmetric shape with respect to the center wavelength.

6. The laser according to claim 1, wherein the spectral distribution of radiant intensity is a superposition of a first and a second peaked spectral intensity distribution having a respective first and second bandwidth, first and second peak wavelength, and first and second intensity, and wherein the adjustment comprises a change of
  difference between the first and second peak wavelength and difference between the first and second bandwidth,
  difference between the first and second peak wavelength and difference between the first and second intensity, or
  difference between the first and second peak wavelength and difference between the first and second bandwidth and difference between the first and second intensity.

7. An excimer laser comprising:
  a radiation system to provide a beam of electro-magnetic radiation having a spectral distribution of radiant intensity; and
  a controller configured and arranged to control the radiation system to provide an adjustment of the spectral distribution of radiant intensity based on data relating to a feature arranged at a first pitch and at a second pitch in a pattern and representing a corresponding first printed size and second printed size of the feature, the pattern being that of a patterning device used to modulate the radiation for projection onto a radiation-sensitive target portion of a substrate by a lithographic apparatus.

8. The laser according to claim 7, wherein the spectral distribution of radiant intensity comprises a spectral intensity peak having a bandwidth and wherein the adjustment comprises a change of the bandwidth.

9. The laser according to claim 8, wherein the spectral distribution of radiant intensity is a superposition of a first and a second peaked spectral intensity distribution having a respective equal first and second bandwidth, and a respective equal first and second intensity, and a respective first and second peak wavelength, and wherein the adjustment comprises a change of difference between the first and second peak wavelength.

10. The laser according to claim 8, further comprising a bandwidth-controller arranged to control a bandwidth of the spectral distribution of radiant intensity, the bandwidth-controller constructed and arranged to adjust the bandwidth in reaction to a user supplied signal representative for a selected bandwidth of the spectral distribution.

11. The laser according to claim 10, wherein the signal representative for a selected bandwidth of the spectral distribution is provided by the controller.

12. The laser according to claim 7, wherein the spectral distribution of radiant intensity comprises a spectral intensity peak having, with respect to a center wavelength, a symmetric shape and wherein the adjustment comprises a change of the symmetric shape into an asymmetric shape with respect to the center wavelength.

13. The laser according to claim 7, wherein the data represent a difference between the corresponding first printed size and second printed size of the feature.

14. The laser according to claim 13, wherein the data further comprise a target difference between the corresponding first printed size and second printed size of the feature.

15. The laser according to claim 14, wherein the adjustment of said spectral distribution of radiant intensity is arranged to match the difference to the target difference.

16. The laser according to claim 15, wherein the target difference is a difference between the corresponding first printed size and second printed size of the feature, as printed using the patterning device on respectively a first lithographic apparatus and a second lithographic apparatus.

17. The laser according to claim 7, wherein the spectral distribution of radiant intensity is a superposition of a first and a second peaked spectral intensity distribution having a respective first and second bandwidth, first and second peak wavelength, and first and second intensity, and wherein the adjustment comprises a change of one of
  difference between the first and second peak wavelength and difference between the first and second bandwidth,
  difference between the first and second peak wavelength and difference between the first and second intensity, or
  difference between the first and second peak wavelength and difference between the first and second bandwidth and difference between the first and second intensity.

18. The laser according to claim 17, wherein the difference between the first and second peak wavelength is selected from the group consisting of between 0 and 1 pm, and between 0 and 0.5 pm.

19. An excimer laser comprising:
  a radiation system to provide a beam of electro-magnetic radiation having a spectral distribution of radiant intensity; and
  a controller configured and arranged to control the radiation system to provide the beam with a spectral distribution of radiant intensity having an asymmetric shape with respect to a center wavelength based on data relating to a feature arranged at a first pitch and at a second pitch in a pattern and representing a corresponding first printed size and second printed size of the feature, the pattern being that of a patterning device used to modulate the radiation for projection onto a radiation-sensitive target portion of a substrate by a lithographic apparatus.

* * * * *